United States Patent [19]

Sawada

[11] Patent Number: 5,408,429
[45] Date of Patent: Apr. 18, 1995

[54] METHOD OF ALTERING A NON-VOLATILE SEMICONDUCTOR MEMORY DEVICE

[75] Inventor: Kikuzo Sawada, Sagamihara, Japan

[73] Assignee: Nippon Steel Corporation, Japan

[21] Appl. No.: 50,660

[22] Filed: Apr. 22, 1993

[30] Foreign Application Priority Data

Apr. 24, 1992 [JP] Japan .................................. 4-131491

[51] Int. Cl.⁶ .............................................. G11C 16/04
[52] U.S. Cl. .................................... 365/185; 365/182; 365/900; 365/218
[58] Field of Search ................... 365/185, 189.01, 218, 365/182, 900

[56] References Cited

U.S. PATENT DOCUMENTS

| | | | |
|---|---|---|---|
| 5,047,981 | 9/1991 | Gill et al. | 365/185 |
| 5,122,985 | 6/1992 | Santin . | |
| 5,222,040 | 6/1993 | Challa | 365/185 |
| 5,313,432 | 5/1994 | Lin et al. | 365/230.06 |

FOREIGN PATENT DOCUMENTS 61-127179  6/1986  Japan .
3-219496   9/1991  Japan .

OTHER PUBLICATIONS

"Si Thermally-Oxidized Film and Its Interface" pp. 355–371, Realize Corp.
"Design of CMOS Ultra-LSI", 1989, pp. 172–173.
"Flash Memory Technology and Its Future", Yasushi Terada, Institute of Electronics, Information and Communication Engineers of Japan ICD91-134, 1991, pp. 1–8.
"Flash Memory with Negative Voltage Scheme", T. Tanaka et al., Inst. of Elec., Information and Communication Engineers of Japan ICD91-135, 1991, pp. 9–14.
"The Cell Technology of a 16 M Flash Memory is Converging" Nikkei Micro Device Jul. 1991, pp. 73–75.
"Flash EEPROM Cell Scaling Based on Tunnel Oxide Thinning Limitations" K. Yoshikawa et al. 1991 VLSI Symposium Technology, pp. 77–80.

Primary Examiner—Joseph A. Popek
Assistant Examiner—Huan Hoang
Attorney, Agent, or Firm—Pollock, Vande Sande & Priddy

[57] ABSTRACT

A method for writing data to a selected EEPROM memory cell and erasing data in a selected EEPROM memory cell. During writing of the EEPROM memory cell, a tunnel effect is used to draw charges from the charge injection layer of a memory transistor into the drain. A negative voltage lower than ground potential is applied to the control gate of the selected memory cell and the presence or absence of the tunnel effect is controlled by the level of voltage applied to the drain of the selected memory cell. Other memory cells which are not being written with data are maintained free of the tunnel effect by applying a voltage higher than the gate voltage of the selected memory cell, and lower than the threshold voltage of the control gate to the non-selected memory cell with respect to its drain connection. During erasing of a selected memory cell, the power supply voltage for the memory is applied to the control gate of the selected memory cell and the drain and source are grounded. The control gate of the non-selected memory cell is placed at a ground potential, inhibiting erasing of the non-selected cell.

18 Claims, 7 Drawing Sheets

F I G. 3
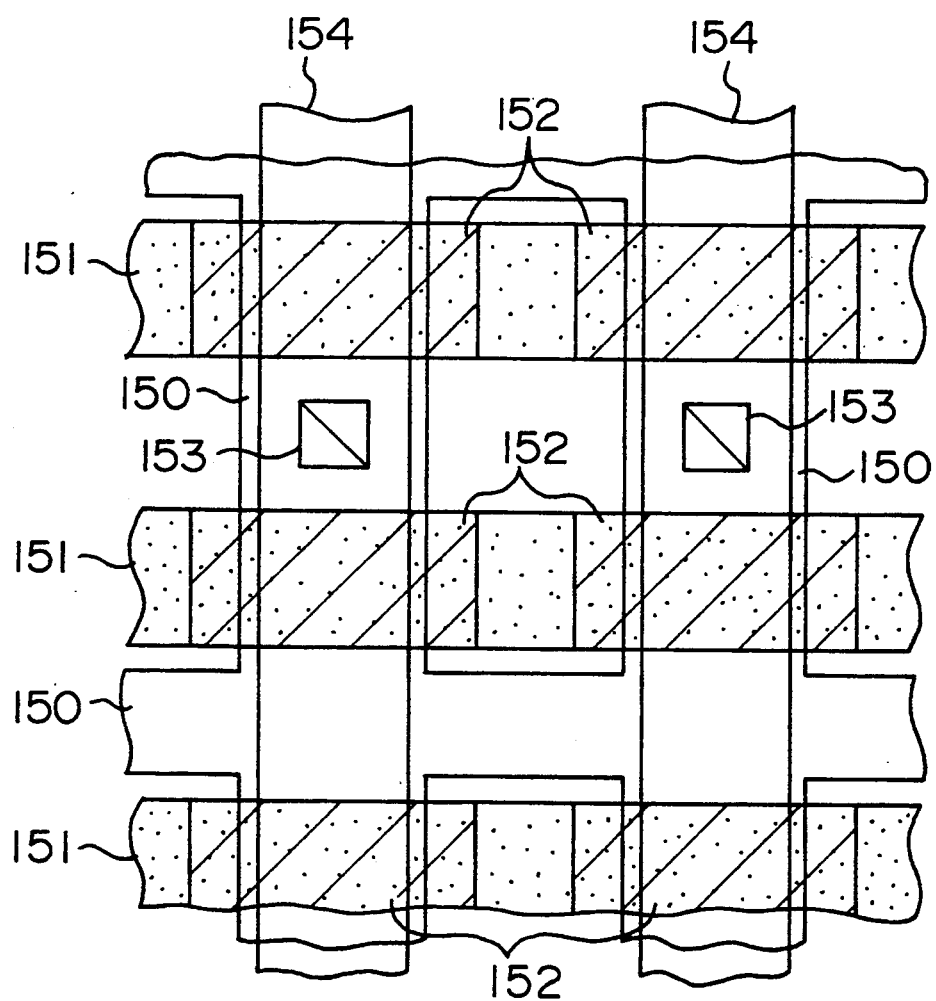

F I G. 4
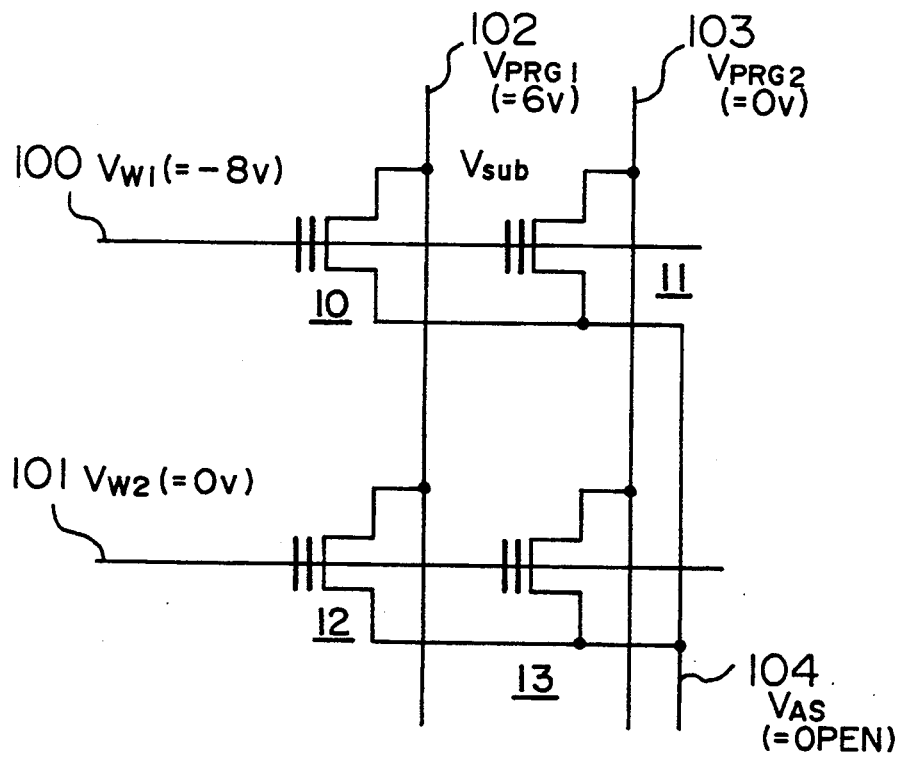
F I G. 5
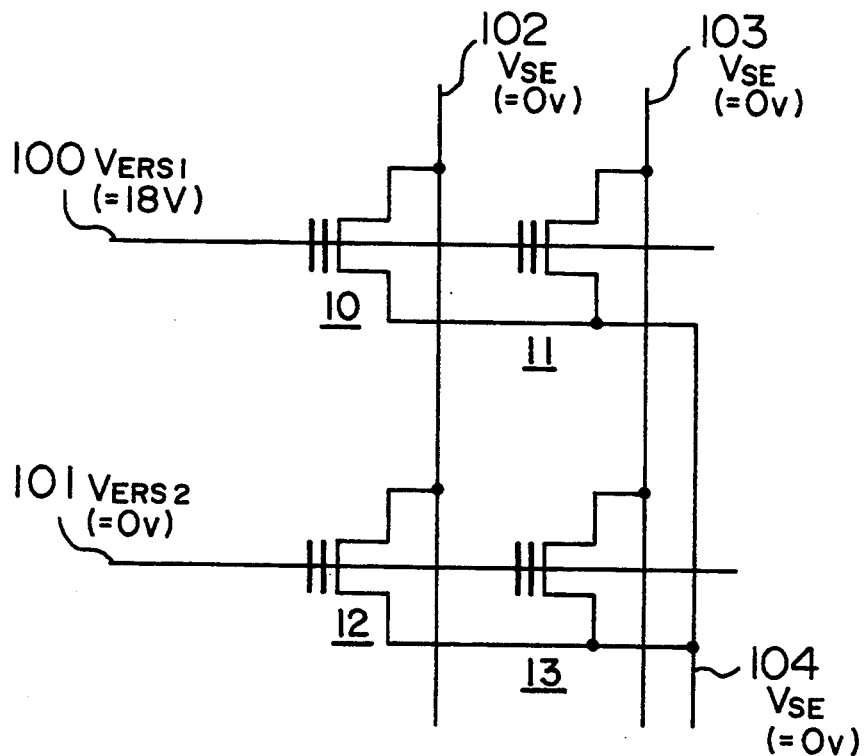

METHOD OF ALTERING A NON-VOLATILE SEMICONDUCTOR MEMORY DEVICE

BACKGROUND OF THE INVENTION

1. Field of the Invention

The present invention relates to a method of altering the contents of memory cells of an electrically alterable non-volatile semiconductor memory device (hereinafter referred to as EEPROM), which is applicable to an EEPROM and a semiconductor device incorporating the EEPROM.

2. Description of the Related Art

The following documents are relating to the present invention.
- Document No. 1: JP-A-61-127179 entitled "Electrically Programmable Memory Device for a Single Transistor and Method of Fabricating the Same"
- Document No. 2: "Design of CMOS ultra-LSI" edited by Takuo Sugano, 1989, pp. 172–173
- Document No. 3: "The Present State and Future Prospects of Flash Memory", The Institute of Electronics, Information and Communication Engineers of Japan, ICD91-134
- Document No. 4: "Flash Memory With Negative Scheme", The Institute of Electronics, Information and Communication Engineers of Japan, ICD91-135
- Document No. 5: "The Cell Technology of a 16M Flash Memory is converging, Nikkei Micro-Device, July 1991
- Document No. 6: "Flash EEPROM Cell Scaling Based on Tunnel Oxide Thinning Limitations" 1991 VLSI Symposium Technology
- Document No. 7: "Si Thermally-oxidized Film and its Interface" pp. 355–371 Realize Corp.
- Document No. 8: JP-A-3-219496 entitled "Non-volatile Semiconductor Memory Device"
- Document No. 9: U.S. Pat. No. 5,122,985

Many proposals for an electrically alterable non-volatile memory cell (hereinafter referred to as EEPROM memory cell) have been made from the early 1980s. The typical one of them is a memory cell having a floating gate as a charge holding layer as disclosed in Documents Nos. 1, 2, 3 and 4.

The EEPROM memory cell having a floating gate includes a crystalline semiconductor Si substrate, source and drain regions formed on the substrate by doping impurities having an opposite conductivity type to that of the impurities in the substrate (where the substrate is a p-type substrate doped with boron(B), the source and drain regions are n-type layers doped with arsenic (As) or phosphorus (P)), a channel region between the source and drain through which minority carriers pass, a thin oxide film in contact with the upper surface of the channel region, a floating gate made of conductive polysilicon in contact with the upper surface of the thin oxide film, and a control gate made of polysilicon in contact with the upper surface of the floating gate.

The theory of memorizing the above EEPROM is that the threshold voltage of the memory cell viewed from the control gate is altered by injecting and storing charges (electrons or holes) in the floating gate (the threshold voltage is defined as the minimum voltage applied to the control gate required for a memory cell to make a detectable response). An example of the prior art method of injecting charges into the floating gate is shown in FIGS. 8 and 9 (This prior art is disclosed in Document No. 1 as a prior art and in Document No. 2).

The prior art memory cell array shown in FIGS. 8 and 9 requires a single MOS enhancement N-channel transistor (20, 21, 22 or 23 in FIG. 8) and a single memory cell (24, 25, 26 or 27 in FIG. 8) having a floating gate for selecting and storing 1-bit information. The prior art shown in FIG. 8 can select and store the information corresponding to 4 (four) bits. In FIG. 8, a word line 200 is connected to the gate of each of transistors 18, 20 and 21. A word line 201 is connected to the gate of each of transistors 19, 22 and 23. A bit line 203 is connected to the drain of each of the transistors 20 and 22. A bit line 204 is connected to the drain of each of the transistors 21 and 23. The drain of each of the transistors 18 and 19, which is a MOS enhancement channel transistor for selecting one byte, is connected to a sense line 202. The threshold voltage of each of the transistors 18, 19, 20, 21, 22 and 23 is e.g. 1 V (volts). The source of the transistor 18 is connected to the control gate 206 of each of the transistors 24 and 25, and the source of the transistor 19 is connected to the control gate 207 of each of the transistors 26 and 27. The source of each of the transistors 20, 21, 22 and 23 is connected to the drain of an associated one of the transistors 24, 25, 26 and 27 through an n-type impurity diffused layer.

FIG. 9 is a sectional view taken along line IX—IX in FIG. 8 and corresponds to 1 bit. In FIG. 9, reference numeral 220 denotes a P-type Si substrate; 205', 208 and 203' an N-type impurity diffused layer; 223 and 224 a Si thermally-oxidized film (gate oxide film) on the channel; and 225 a Si thermally-oxidized film which is sufficiently thinner than any of the oxide films 223 and 224 (e.g. the films 223 and 224 are 50 nm thick whereas the film 225 is 10 nm thick). Reference numeral 206 denotes a control gate made of e.g. polysilicon; 227 an interlayer insulating film (e.g. thermally oxidized film having a thickness of about 25 nm); and 200 a gate made of e.g. polysilicon. Reference 228 denotes an insulating layer; 203 a bit line mainly made of aluminum (Al); and 229 a contact connecting the bit line 203 with the N-type impurity diffused layer 203'. While the polysilicons of the gates 200 and 206 are electrically connected to other memory cells, the floating gate is electrically insulated from the other memory cells.

The electric equivalent circuit of the memory cell shown in FIGS. 8 and 9 is shown in FIG. 10. In FIG. 10, a voltage Vg is applied to a control gate 206; Vd to a drain 208, Vs to a source 205; and Vsub to a substrate 220. In FIG. 9, the oxide films 224 and 225 and the interlayer insulating film 227 can be represented by capacitance in the electrical viewpoint. A capacitance between the floating gate 226 and the control gate 206 is denoted by Cip; a capacitance between the floating gate 226 and the drain 208 by Cd; a capacitance between the floating gate 226 and the source 205 by Cs; and a capacitance between the floating gate 226 and the substrate by Csub. From the conservation law of electric charge, the voltage Vf at the floating gate 226 can be expressed by $$Cip\,(Vg-Vf) = Cs\,(Vf-Vs) + Csub\,(Vf-Vsub) + Cd\,(Vf-Vd) \qquad (1)$$

In Equation (1), if $Vs = Vsub = Vd = 0$ V, $$Vf = Vg \times Rp \qquad (2)$$

where Rp=Cip/(Cip+Cd+Csub+Cs). Rp is called a coupling ratio, generally Rp=0.55 to 0.7.

An explanation will be given of the method of altering and reading the prior art memory cell shown in FIGS. 8 and 9. Table 1 shows examples of the node voltages in each operation mode. Altering includes writing and erasing. Now, the case where the memory cell 24 is selected is taken as an example.

TABLE 1

| operation mode | | each node voltage | | | | | | | | |
|---|---|---|---|---|---|---|---|---|---|---|
| | | 200 | 201 | 202 | 203 | 204 | 205 | 206 | 208 | 225 |
| alter | write | +20v | 0v | 0v | +20v | 0v | open | 0v | +18v | 0v |
| | erase | +20v | 0v | +20v | 0v | 0v | 0v | +18v | 0v | 0v |
| read | | +5v | 0v | +3v | +2v | 0v | 0v | +3v | +2v | 0v |

In a write operation for the memory cell 24, for example, 20 V is applied to the word line 200, 0 V is applied to the sense line 202, 20 V is applied to the bit line 203 and the source 205 is opened. Thus, the transistors 18, 20 and 21 turn on so that the control gate 206 is at 0 V and the drain 208 is at about 18 V (20 V is the threshold voltage (including substrate effect) of the transistor 20). As a result, a voltage of about 7 V is induced in the floating gate 226. Since the oxide film is as thin as 10 nm, a Flower-Nordheim tunnel (FN tunnel) current due to a potential difference between the floating gate 226 and the source 208 flows through the thin oxide film 225. Generally, the FN tunnel current flows when an electric field of 10 MeV/cm or larger is applied to the thin oxide film. This FN tunnel current causes holes to be injected from the drain 208 into the floating gate 226. This lowers the threshold voltage of the memory cell (For example, when the initial threshold voltage of the memory cell is 2 V, the threshold voltage after writing is −2 V to −3 V). Then, the bit line 204 is at 0 V and the word line 201 is at 0 V so that a high voltage is not applied to the memory cells other than the memory cell 24, and write for these memory cells is not carried out.

In an erasing operation for the memory cell 24, for example, 0 V is applied to the word line 200, 20 V is applied to the sense line 202, and 0 V is applied to the bit line 203 so that the control gate 206 is at about 18 V and the drain is at 0 V. Thus, about 11 V is induced in the floating gate 226. Then, the FN tunnel current flowing through the oxide film 225 causes electrons to be injected into the floating gate 226. This enhances the threshold voltage of the memory cell (e.g. to 6 to 7 V). Then, the word line 201 is at 0 V so that the gate 207 is opened, and so the memory cells 26 and 27 are not erased. On the other hand, like the memory cell 24, the memory cell 25 will be erased because the bit line 204 is at 0 V. In short, in the erasing operation, all the memory cells connected to the same node or the gate 206 are erased to enhance their threshold voltage.

In a read operation for the memory cell 24, for example, 5 V is applied to the word line 200, 3 V is applied to the sense line 202, and 2 V is applied to the bit line 203. Thus, the transistors 18 and 20 turn on so that the drain 208 of the memory cell 24 is at 2 V and the control gate 206 thereof is at 5 V. Then, if the threshold voltage of the memory cell is as high as 6–7 V, the memory cell 24 is "off" so that no current flows between its source and drain. If the threshold voltage of the memory cell 24 is as low as −2 to 3 V, the memory cell 24 is "on" so that a current flows between its source and drain. Read of the stored information can be made on the basis of the presence or absence (large or small) of the current.

The problem of the above prior art is as follows. In the prior art, in altering the memory cell, the FN tunnel current is used to inject charges. So the altering operation only requires a relatively small current e.g. 10 to 1000 pA (pico-ampere) for one memory cell. This is an advantage of the prior art. But, the prior art has the following defect. In order to make selective writing for the memory array, separation transistors such as the transistors 20, 21, 22 and 23 in FIG. 8 are required to separate the memory cells 24, 25, 26 and 27 from one another (It can be understood that if the transistors 20, 21, 22 and 23 are not provided in FIG. 1, writing of the memory cell 24 results in writing of the memory cell 26). Provision of one separation transistor for one bit requires an occupying area of e.g. 80–150 μm². This defect hinders large-scale integration of memory cells.

The second prior art memory cell array is shown in FIGS. 11 and 12. In order to overcome the defect of the prior art described above, this prior art uses channel hot electrons in writing so that no additional transistor is required. This prior art is disclosed in e.g. Documents Nos. 1, 3, 4 and 5. In FIG. 11, a word line 300 is connected to the gate of each of memory cells 30 and 31, and a word line 301 is connected to the gate of each of memory cells 32 and 33. A bit line 302 is connected to the drain of each of the memory cells 30 and 32, and a bit line 303 is connected to the drain of each of the memory cells 31 and 33. A source line 304 is connected to the source of each of the memory cells 30, 31, 32 and 33.

FIG. 12 is a sectional view taken along line XII—XII in FIG. 11 and corresponds to 1 bit. In FIG. 12, reference numeral 305 denotes a P-type Si substrate; 304' and 302' an N-type impurity diffusion layer; and 306 a Si thermally-oxidized film (having a thickness of e.g. 10 nm) on the channel. Reference numeral 309 denotes a floating gate made of e.g. polysilicon; and 300 a control gate made of e.g. polysilicon. Reference numeral 307 denotes an insulating film (made of nitride or oxide having a thickness of e.g. 25 nm) interposed between the control gate and the floating gate 309. Reference numeral 310 denotes an insulating layer; 302 a bit line mainly made of aluminum (Al); and 308 a contact connecting the bit line 302 with the N-type impurity diffusion layer 302'.

An explanation will be given of the method of rewriting and reading the prior art memory cell shown in FIGS. 11 and 12. Table 2 shows examples of the node voltages in each operation mode which are disclosed in Document No. 4.

TABLE 2

| operation mode | | each node electrode | | | | |
|---|---|---|---|---|---|---|
| | | 300 | 301 | 302 | 303 | 304 |
| alter | write | 12v | 0v | 5v | 0v | 0v |
| | erase | −9v | 0v | open | open | 5v |
| read | | 5v | 0v | 1v | 0v | 0v |

Now it is assumed that the threshold voltage is e.g. 2 V when the floating gate holds no charge. In a writing operation for the memory cell 30 selected in FIG. 11, 12 V is applied to the word line 300; 0 V to the word line 301; 5 V to the bit line 302; 0 V to the bit line 303; and 0 V to the source line 304. Then, with the coupling ratio Rp of 0.6, about 7 V is induced in the floating gate 309. Thus, an electron channel is formed between the drain and source of the memory cell 30. In addition, because the gate voltage and drain voltage are high, hot electrons are created in the vicinity of the drain. The hot electrons pass over the potential barrier between the silicon and gate oxide film to be injected into the floating gate 309.

Such a phenomenon is described in detail in Document No. 7. The injection of channel hot electrons (referred to as CHEs) boosts the threshold voltage of the memory cell 30 to e.g. 6 to 8 V. Then, a current of 300 $\mu$A to 1 mA flows between the drain and source of the memory cell 30. Since the word line 301 is at 0 V and the bit line 303 is at 0 V, write for the memory cells 31, 32 and 33 is not carried out.

In an erasing operation for the memory cell 30, e.g. −9 V is applied to the word line 300, e.g. 0 V is applied to the word line 301, the bit lines 302 and 303 are opened, and 5 V is applied to the source line 304. Then, about −7 V is induced in the floating gate 309 so that electrons are drawn out from the floating gate 309 to the source 304 (=304') owing to the FN tunnel current via the gate oxide film 306. By controlling the amount of the electrons as drawn by a suitable control circuit, the threshold voltage of the memory cell 30 is adjusted to be lowered to a positive low value of 2 to 3 V. This adjustment is necessary because if the threshold voltage is lowered to 0 V or less, in a read operation, a current will flow between the source and drain of a non-selected memory cell, resulting in erroneous read. For this reason, the threshold voltage is adjusted to the above positive value. Additionally, it should be noted that the memory cell 31 will be also erased when the memory cell 30 is erased. Namely, the memory cells on the same word line as the selected memory cell lies will be erased simultaneously. On the contrary, the memory cells 32 and 33 will not be erased because the word line 301 is at 0 V.

In a read operation for the memory cell 30, e.g. 5 V is applied to the word line 300, 0 V to the word line 301, e.g. 1 V to the bit line 302, 0 V to the bit line 303, and 0 V to the source line 304. Then, if the threshold voltage of the memory cell 30 is high (e.g. 6 to 8 V), the memory cell 30 is "off" so that no current flows between its source and drain. If the threshold voltage of the memory cell 30 is low (e.g. 2 to 3) V, the memory cell 30 is "on" so that a current flows between its source and drain. Read of the information can be made on the basis of the presence or absence (large or small) of the current. But, if the voltage applied to the drain of the memory cell 30 (i.e. bit line 302) is 1 V or more, erroneous write may occur because the drain voltage (i.e. the voltage at the bit line 302) is 5 V. (see Document No. 6)

As compared with the first prior art device shown FIGS. 8 and 9, the second prior art device has an advantage that a transistor for separation is not required in selective writing for a memory cell, but has a defect in that a large current is required for the drain of a memory cell because CHE injection is used in writing. In writing by using the FN tunnel current, a required current is low, so that it is possible to operate the memory by using a single power supply of e.g. 3 V, with a boosting circuit such as a charge pump circuit in an integration circuit. On the other hand, in write from the drain using the CHE injection, lowering of the drain voltage is limited because of the necessity of generating hot electrons. For example, even if the minimum machining size in an integrated circuit is lowered from about 0.8$\mu$ to 0.5$\mu$, the required drain voltage can be only reduced from 6 to 7 V to 5 V. Otherwise, even if the drain voltage in writing by using the CHE injection can be reduced to 3 V or so, erroneous read due to the drain voltage is likely to occur in a read operation. This results in less reliability of a memory cell array. In short, in the prior arts, under the restriction of using a single power source for operation (writing and reading), the writing using CHE injection makes it more difficult to reduce the power supply voltage than the writing using the FN tunnel current.

Incidentally, an example of the EEPROM using the FN tunnel effect for writing and erasing is disclosed in U.S. Pat. No. 5,122,985 (Document No.9).

SUMMARY OF THE INVENTION

An object of the present invention is to provide a method of altering a non-volatile semiconductor device having a structure which necessitates no separation transistor for selective write, and permits alteration and read at a low voltage by using a single power supply.

In order to attain the above object, according to the present invention, a method of altering a non-volatile semiconductor memory device having plural memory cells arranged in rows and columns, each memory cell including a source, a drain, a channel region located between the source and drain, a control gate provided over the channel region with an interposed insulating layer and a charge injection layer lying between the control gate and the insulating layer, row lines each connected to the control gates of memory cells on one row, and column lines each connected to the drains of the memory cells on one column, the method comprises the steps of: in a write operation for a selected memory cell, applying a first voltage lower than a ground potential and a second voltage higher than the ground potential to a first row line connected to the control gate of the selected memory cell and a first column line connected to the drain of the memory cell, respectively so that a potential difference between the first voltage and the second voltage causes charges to be injected from the charge injection layer of the selected memory cell into the drain by the tunnel effect, thereby placing said memory cell at a writing level; applying a third voltage lower than the second voltage to a second column line connected to the drain of at least one non-selected memory cell with its control gate connected to the first row line, the third voltage having a value which prevents the tunnel effect to be caused between the charge injection layer and channel region of the non-selected memory cell by a voltage difference between the third voltage and the first voltage; and applying a fourth voltage higher than the first voltage and lower than the second voltage to a second row line connected to the drain of at least one other non-selected memory cell with its drain connected to the first column line, the fourth voltage having a value which prevents the tunnel effect to be caused between the charge injection layer and channel region of the other non-selected memory cell by a voltage difference between the second voltage and the fourth voltage.

Further, a selected memory cell of the semiconductor memory device can be erased by injecting negative charges between the charge injection layer and channel region of the selected memory cell by the tunnel effect or CHE injection.

In the present invention, in a write operation for a selected EEPROM memory cell, the tunnel effect is used to draw out charges from the charge injection layer into the drain. In this case, unlike the prior art, according to the present invention, a negative voltage lower than a ground potential is applied to the control gate of the selected memory cell and the presence or absence of the tunnel effect, i.e. the writing is controlled by the level of the voltage applied to the drain, i.e. high or low (e.g. 5 V or 0 V). The tunnel effect can be prevented by applying a negative voltage to the control gate of the selected memory cell and applying a voltage higher than the negative voltage and lower than the threshold voltage to the control gate of a non-selected memory cell with its drain connected to the row line to which the drain of the selected memory cell is connected. (For example, when the negative voltage is $-8$ V and the threshold voltage of the memory cell is 2 V, the voltage applied to the control gate of the non-selected memory cell is e.g. 0 V).

In an erasing operation for a selected memory cell, when a voltage (e.g. 18 V) higher than the power supply voltage is applied to the control gate of the selected memory cell and the drain and source are grounded, electrons are injected from a substrate into the charge injection layer by the tunnel effect. When the control gate of the non-selected memory cell is placed at a ground potential, the tunnel effect does not occur so that the non-selected memory cell is not erased.

Now, in the specification and claims, the term "tunnel effect" means either the FN tunnel effect or the direct tunnel effect. The term "charge injection layer" means not only the floating gate of polysilicon but also a layer such as an insulating layer of nitride to which charges can be injected and stored.

The term "writing level" is used to indicate the state where the threshold voltage of a memory cell is lower than the level of a voltage applied to the control gate of the memory cell for reading out the information written in the memory cell, while the term "erasing level" is used to indicate the state where the threshold voltage of the memory cell is higher than the level of a voltage applied to the control gate of the memory cell for reading out the information written in the memory cell.

BRIEF DESCRIPTION OF THE DRAWINGS

FIG. 3 is a plan view showing the layout of respective elements of the semiconductor memory device shown in FIG. 1;

FIG. 4 shows voltage values applied to various electrodes of the semiconductor memory device shown in FIG. 1 when a write operation is performed in accordance with the first embodiment of the present invention;

FIG. 5 shows voltage values applied to various electrodes of the semiconductor memory device shown in FIG. 1 when an erasing operation is performed in accordance with the first embodiment of the present invention;

DESCRIPTION OF THE PREFERRED EMBODIMENTS

Figure 1:
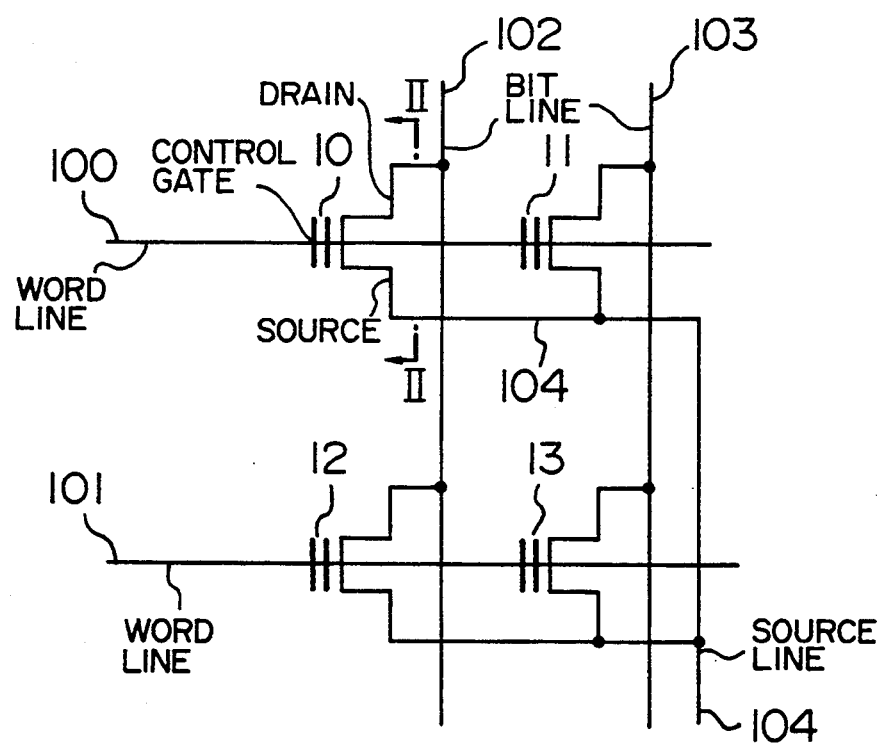
FIG. 1 is a view of the electric circuit of a semiconductor memory device to which the method according to the present invention is applied.

Now referring to the drawings, an explanation will be given of several embodiments of the present invention.

Embodiment 1

The first embodiment of the present invention is shown in FIGS. 1 to 5. In FIG. 1, reference numerals 10, 11, 12, and 13 denote an EEPROM memory cell having a floating gate as a charge injection layer, for example. Each memory cell has a drain terminal, a source terminal, a control gate terminal and the floating gate. Reference numerals 100 and 101 denote a word line; any of the word lines can be selected or non-selected by a decode circuit for row lines. The word line 100 is connected to the respective control gates of the memory cells 10 and 11, and the word line 101 is connected to the respective control gates of the memory cells 12 and 13. Reference numerals 102 and 103 denote a bit line; any of the bit lines can be selected or non-selected by a decoder circuit for column lines. The bit line 102 is connected to the respective drains of the memory cells 10 and 12, and the bit line 103 is connected to the respective drains of the memory cells 11 and 13. Reference numeral 104 denotes a source line to which the respective sources of the memory cells 10, 11, 12 and 13 are connected.

Figure 2:
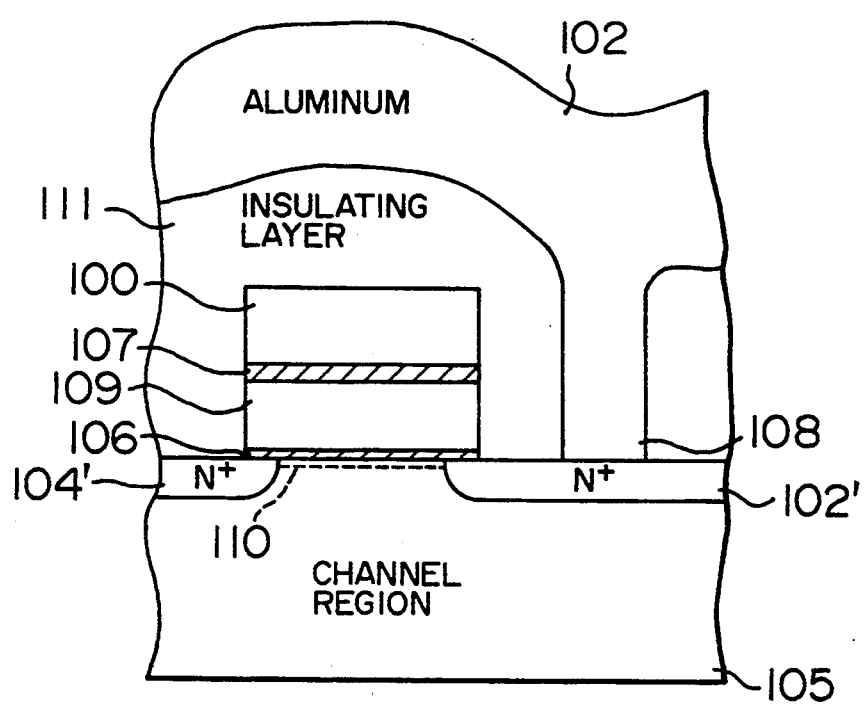
FIG. 2 is a sectional view taken along a line II—II in the semiconductor memory device shown in FIG. 1.

FIG. 2 shows a section of the EEPROM according to this embodiment, taken along a line II—II in FIG. 1. Reference numeral 105 denotes a semiconductor P-type Si substrate, and reference numerals 104' and 102' denote N-type diffused layers which serve as a source and a drain, respectively. Between the layers 104' and 102', a channel region 110 is located which induces an electron conductive layer (channel) in accordance with a gate voltage. On the channel region 110 a thin film insulating film 106 (e.g. a thermally oxidized film having a thickness of 10 nm) is provided. The channel region 110 has a width of e.g. 0.6 to 1 μm. On the thin insulating film 106, a floating gate 109 made of a conductive polysilicon is provided at a thickness of e.g. 150 nm. On the floating gate 109 a thin insulating film 107 is provided which is e.g. an insulating film made of oxide or nitride having a thickness of 25 nm. On the thin insulating film 107, a control gate 100 is provided which is made of e.g. conductive polysilicon. The control gate 100 has a thickness of 250 nm. Reference numeral 102 denotes a bit line mainly made of aluminum (Al). The bit line 102 is connected to the N-type diffused layer (drain) 102' through a contact region 108. Between the bit line 102 and the control gate 100, an insulating layer 111 is provided. Incidentally, the threshold voltage when charges are not injected in the floating gate is set at e.g. 2 V.

FIG. 3 shows a plan view of memory cells according to this embodiment. Reference numeral 150 denotes an N-type diffused layer (drain, source and source line of each memory cell); 151 a word line (control line); 152 a floating gate; 154 a bit line; and 153 a contact region. In FIG. 3, the area occupied by 1 (one) bit is e.g. 10 $\mu m^2$.

Now referring to FIGS. 1 to 4, an explanation will be given of an altering method according to this embodiment. FIG. 4 shows various voltages applied in writing in FIG. 1. For writing for the memory cell 10, the following voltages are applied. To the word line 100 (control gate) a voltage $Vw1$ of $-4$ to $-15$ V, preferably $-8$ V is applied. To the drain 102 a voltage $Vprg1$ of e.g. 6 V is applied which is effective to apply an electric field of 10 MeV/cm or more to the insulating film 106. To the P-type substrate a voltage $Vsub$ of e.g. 0 V is applied. The source line 104 which is at a voltage $Vas$ is opened for example. In this case, the voltage relationship of $Vprg1 > Vsub \approx 0 V > Vw1$ stands. Then, a negative voltage is applied to the word line (control gate) 100 so that the memory cells 10 and 11 are "off", and thus no channel is formed. By applying the above values to Equation (1) and assuming that Rp is e.g 0.6 and the values of Cd and Cs are much smaller than that of Cip, a potential difference between the floating gate 109 and the drain 102' will be about 10.5 V. Owing to this potential difference, an FN tunnel current flows so that electrons are drawn from the floating gate 109 to the drain 102'. The cell, which is to be written, is at the erasing level before writing so that the threshold voltage is lowered when the electrons are drawn. In order to prevent the threshold voltage from being excessively lowered, the writing time is appropriately controlled so as to place the threshold voltage at 2 V.

Further, in the write operation for the memory cell 10, to the word line (control gate) 101 a voltage $Vw2 < 3$ V, e.g. $Vw2 = 0$ ($Vw2 > Vw1$) is applied, and to the bit line 103 a voltage $Vprg2 < Vprg1$, e.g. 0 V is applied. Then, a potential difference of 8 V is generated between the control gate and drain of the memory cell 11 so that a voltage of 7 V will be generated in the floating gate of the memory cell 11. But this potential difference cannot cause the FN tunnel current to flow so that the threshold voltage of the memory cell 11 remains unchanged. Further, although a voltage of about 5.5 V is generated between the floating gate and drain of the memory cell 12, this potential difference cannot also cause the FN tunnel current to flow so that the threshold voltage of the memory cell 12 remains unchanged. In the memory cell 13 in which no potential difference is generated between its drain and source, the threshold voltage does not change.

An erasing method according to this embodiment will be explained below. FIG. 5 shows various voltages applied in erasing in FIG. 1. For erasing for the memory cell 10, the following voltages are applied. To the word line (control gate) 100 a voltage $Vers1$ of 9 to 22 V, preferably 18 V is applied. To the bit lines (drain) 102 and 103 and the source line 14, a voltage $Vse$ of 0 V ($Vers1 > Vse$) is applied. In this case, since a high voltage of 18 V is applied to the control gate of the memory cell 10, the memory cells 10 and 11 are "on" so that a channel is formed. Thus, the bit lines 102 and 103 and the source line 104 are placed at the same voltage. Since a voltage of 18 V is applied between the floating gate and channel of the memory cell 10 and assuming that $Rp = 0.6$, a voltage of about 11 V is induced in the floating gate of the memory cell 10. Then, owing to the FN tunnel current, electrons are injected from the channel region into the floating gate. Thus, the threshold voltage becomes high to e.g. 6 to 8 V. Since the word line 101 is at 0 V, the threshold voltages of the memory cells 12 and 13 do not change. The memory cell 11, to which the same voltages as those applied to the memory cell 10 are applied, will be erased. Specifically, also in this embodiment, memory cells connected to the word line, to which the selected memory cell is connected, will be erased. This is also true of the prior art.

Additionally, although various voltage values were exemplified for explanation of this embodiment, these values may be changed in accordance with the structure of a memory cell, particularly capacitances of the oxide film and interlayer insulating film and the coupling ratio. They may be any value so long as they satisfy the relationship as defined in claims.

This embodiment has the following meritorious effects. In accordance with this embodiment, a memory array can be realized which uses the tunnel effect for writing, but does not require the transistor for separation which was required in the prior art. Thus, the occupying area can be greatly reduced as compared with the first prior art. Further, since channel hot electron (CHE) injection is not used for writing, the voltage applied to the drain in reading can be made higher than in the second prior art (1 V in the second prior art, whereas 2 V in this embodiment). Thus, a large "on" current can be taken in reading the memory cell. As a result, in accordance with this embodiment, reading can be carried out at a high speed. Moreover, in accordance with this embodiment, a single power supply voltage as used can be reduced because the FN tunnel current is used. Further, in accordance with this embodiment, the erasing results in making higher the threshold voltage so that a problem of excessive erasure does not occur. On the other hand, the second prior art involves a problem of excessive erasure due to process fluctuation in collectively erasing the entire memory array. In order to prevent this excessive erasure, the erasing operation must be carried out in time-division mode so as to perform a verifying operation on the way of the erasing operation. This makes longer the erasing time (For example, about 900 msec is required for the integration degree of 1M bits). In accordance with this embodiment, the collective erasing can be completed within 20 msec.

Embodiment 2

Figure 6:
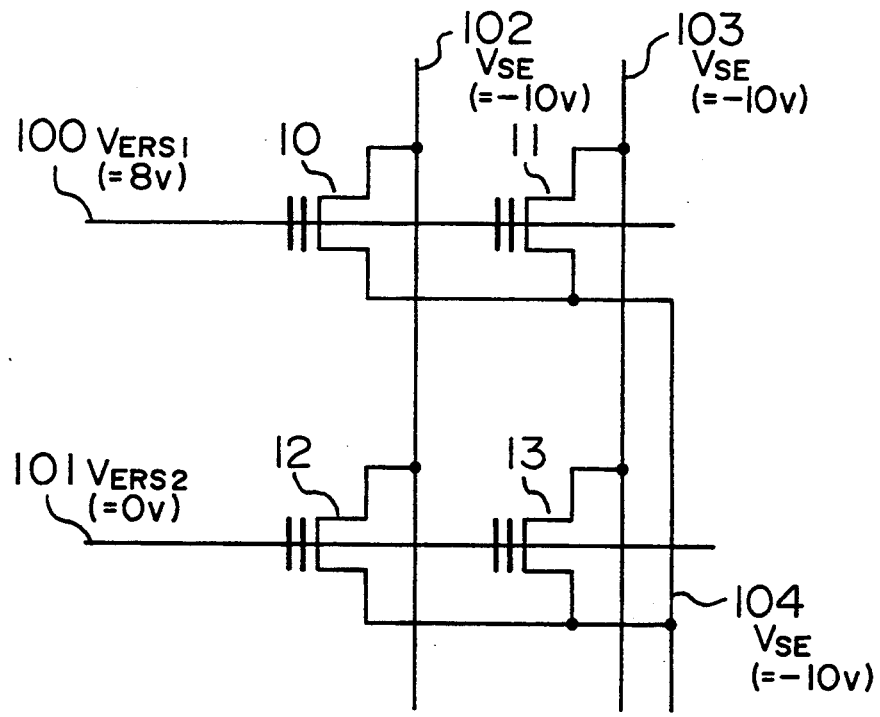
FIG. 6 shows voltage values applied to various electrodes of the semiconductor memory device shown in FIG. 1 when an erasing operation is performed in accordance with the second embodiment of the present invention.

Referring to FIG. 6 an explanation will be given of an altering method according to the second embodiment of the present invention. In this embodiment, the write operation is performed in the same manner as in the first embodiment. But the erasing operation is different from the first embodiment. FIG. 6 shows various voltages applied in erasing in the second embodiment. In FIG. 6, the same reference numerals and symbols refer to like elements in FIG. 1. For erasing for the memory cell 10, the following voltages are applied. To the word line (control gate) 100 a voltage Vers1 of 7 to 18 V, preferably 8 V is applied. To the bit lines (drain) 102 and 103 and the source line 104, a voltage Vse of −4 to 22 V (Vers1>0 V>Vse), preferably −10 V is applied. In this case, since a high voltage of 10 V is applied to the control gate of the memory cell 10, the memory cells 10 and 11 are "on" so that a channel is formed. Then, the substrate of the memory cell is placed at the same voltage as Vse. Since a potential difference of 18 V is present between the floating gate and channel of the memory cell 10, as in the first embodiment, owing to the FN tunnel current, electrons are injected from the channel region into the floating gate. Thus, the threshold voltage of the memory cells 10 and 11 becomes high. Further, when a voltage Vers2 of e.g. 2 V is applied to the word line 101, a potential difference of 8 V is present between the control gate and the drain/source/substrate of each of the memory cells 12 and 13. Thus, a potential difference of about 6 V is induced between the floating gate and the drain/source/substrate thereof. But this potential difference is insufficient to cause the FN tunnel current to flow so that the threshold voltages of the memory cells 12 and 13 do not change.

In accordance with this embodiment, in addition to the technical effects by the first embodiment, a high voltage (particularly Vers1) used for writing and erasing can be set to a relatively low value so that the voltage of transistors in a peripheral circuit of memory cells for controlling the high voltage can be designed as a relatively low value. Particularly, the width of the element or field isolation region to which a high voltage is applied can be made smaller than in the first embodiment so that an EEPROM having a smaller occupying area can be realized.

Embodiment 3

Figure 7:
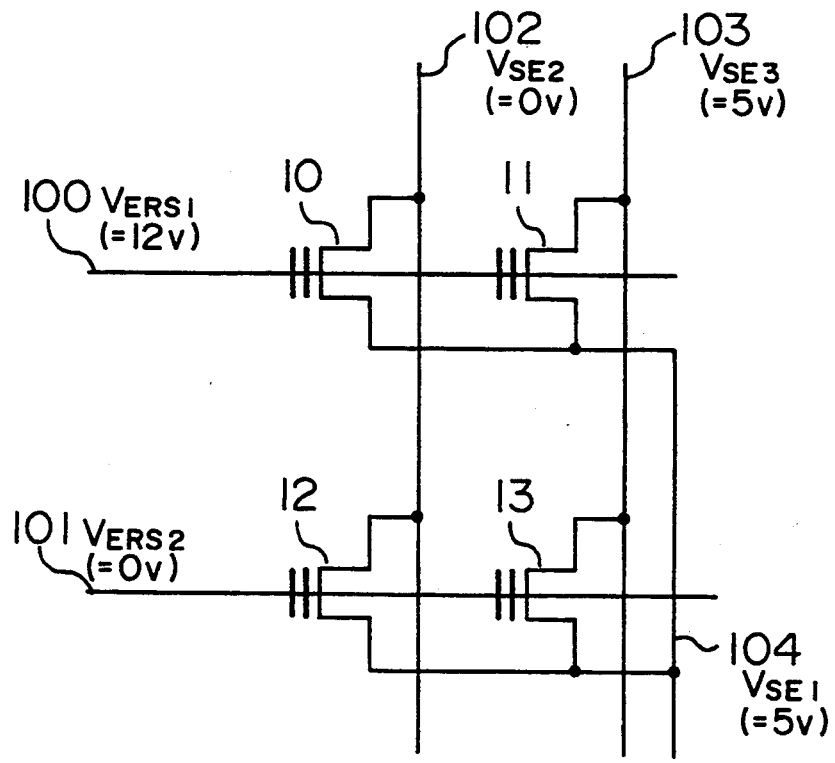
FIG. 7 shows voltage values applied to various electrodes of the semiconductor memory device shown in FIG. 1 when an erasing operation is performed in accordance with the third embodiment of the present invention.
Figure 8:
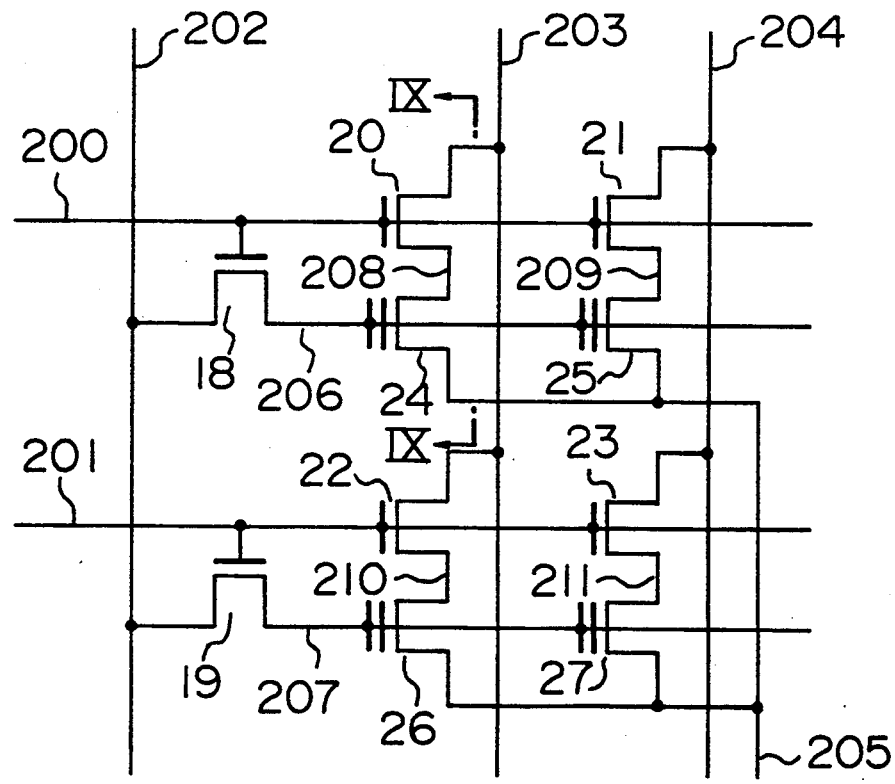
FIG. 8 is an electric circuit of the prior art semiconductor memory device.
Figure 9:
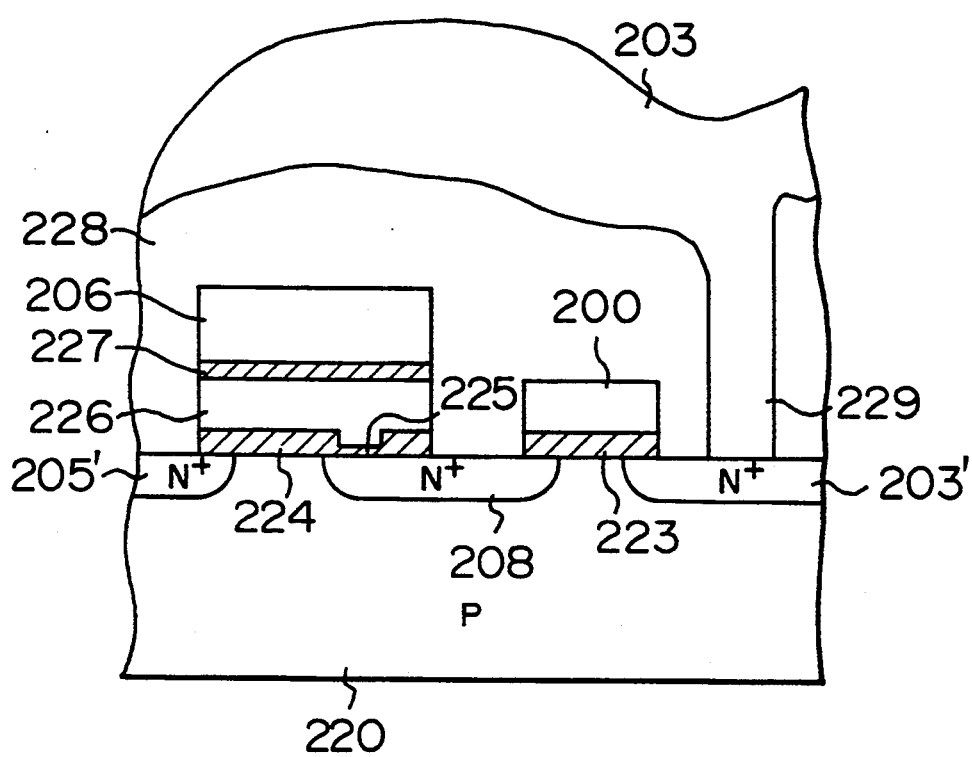
FIG. 9 is a sectional view taken along a line IX—IX of the semiconductor memory device shown in FIG. 8.
Figure 10:
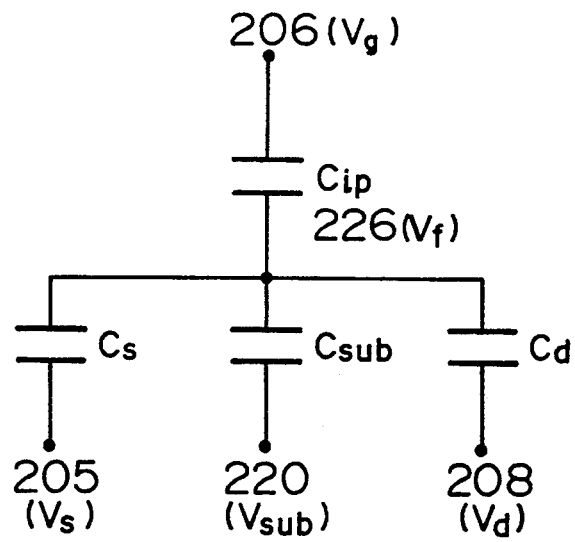
FIG. 10 is an electric equivalent circuit of a single memory cell of the semiconductor memory device shown in FIG. 8.
Figure 11:
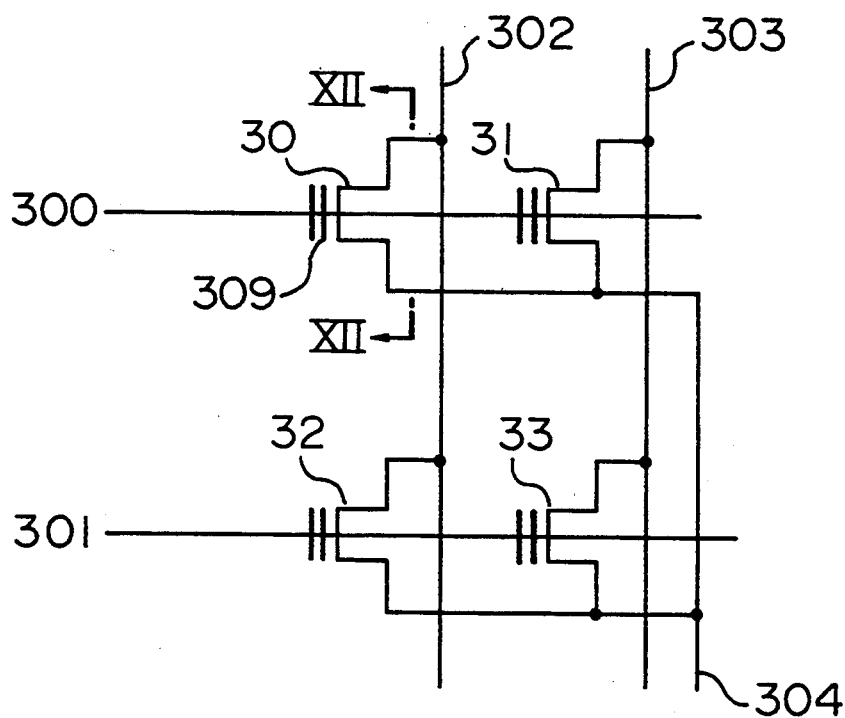
FIG. 11 is an electric circuit of another prior art semiconductor memory device.
Figure 12:
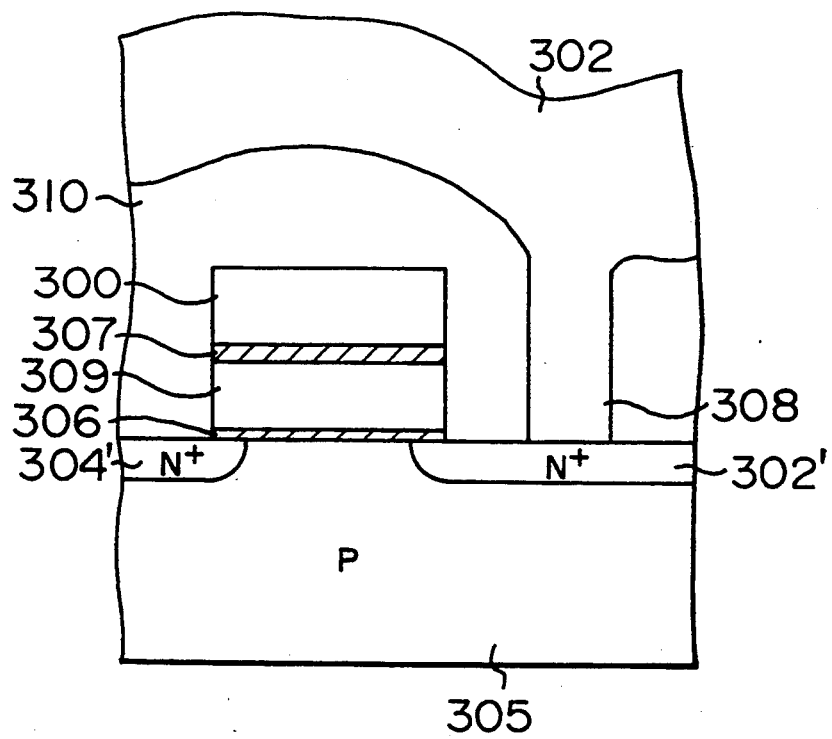
FIG. 12 is a sectional view taken along a line XII—XII of the semiconductor memory device shown in FIG. 11.

Referring to FIG. 7, an explanation will be given of an altering method according to the third embodiment of the present invention. In this embodiment, the writing operation is performed in the same manner as in the first embodiment. But the erasing operation is different from the first embodiment. FIG. 7 shows various voltages applied in erasing in the third embodiment. In FIG. 7, the same reference numerals and symbols refer to like elements in FIG. 1. For erasing for the memory cell 10, the following voltages are applied. To the word line (control gate) 100 a voltage Vers1 of 7 to 18 V, preferably 12 V is applied. To the source line 104 a voltage Vse1 of 2 to 9 V, preferably 5 V is applied. To the bit line 102 a voltage Vse2 of 0 to 2 V, preferably 0 V is applied. There is a voltage relationship of Vers1>Vse1>Vse2≧0 V. In this case, since 12 V, 5 V and 0 V are applied to the control gate, source and drain of the memory cell 10, respectively, hot electrons are generated in the vicinity of the source and CHE injection occurs. Thus, the threshold voltage of the memory cell 10 becomes higher. Then, when a voltage of Vers2 of 0 V (Vers1>Vers2) is applied to the word line 101, the control gate, drain and source of the memory cell 12 are at 0 V, 0 V and 5 V, respectively so that the memory cell 12 remains "off" and its threshold voltage does not change. Further, when a voltage Vse3 of 2 to 9 V, preferably 5 V (Vse3=Vse1>Vse2) is applied to the bit line 103, the control gate, drain and source of the memory cell 11 are at 12 V, 5 V and 5 V, respectively. Since the control gate voltage is 12 V, the memory cell 11 becomes "on", a channel is formed. But there is no potential difference between the source and drain so that no channel current flows and no CHE injection occurs. No FN tunnel current flows because of the small potential difference. As a result, the threshold voltage of the memory cell 11 does not change. To the control gate, drain and source of the memory cell 13, 0 V, 5 V and 5 V are applied, respectively. But the memory cell is "off" and the potential difference is small so that the threshold voltage of the memory cell 13 does not also change.

A memory array of this embodiment does not require separation transistors which are required in the first prior art. Further, since the FN tunnel current is used for writing and CHE injection from the source is used for erasing, this embodiment has the following advantageous effects as compared with the second prior art. One of them is that the prior art permits selective erasure for only one byte (or one word or one sector) whereas this embodiment permits selective erasure for one bit. In addition, in order to implement the selective erasure for one byte (or one word or sector), the prior art is required to provide a transistor for byte (or word or sector) selection separately from the memory cells, or separate source line for one byte (or one word or one sector). On the contrary, this embodiment can realize the erasure for one bit without using these redundant transistors. Thus, in contrast to the prior art, in accordance with this embodiment, any memory cell can be altered without altering unnecessary memory cells, and the occupying area of the memory array can be reduced.

Another advantageous effect is as follows. In reading the stored information from the memory cells, in both the present invention and the prior art, the information is read in such a manner that a constant voltage is applied to the drain of a memory cell and the source is grounded. But, in accordance with this embodiment, CHE injection can be carried out from the source so that erroneous erasure (erroneous writing in the second prior art) due to the drain voltage will not occur. Thus, the drain voltage in writing can be set to a higher value than in the second prior art and the reading speed can be improved. In this embodiment, the drain voltage in reading and the source voltage in writing are independent of each other so that the CHE injection at a low voltage can be more easily realized than in the prior art.

As modifications of the embodiments of the present invention, an altering system can be realized in which the first embodiment is combined with the third embodiment, or the second embodiment is combined with the third embodiment. In this altering, the erasure for one bit can be made by the method according to the third embodiment while the erasure for one sector or one larger memory array (including memory cells in a block or entire EEPROM chip) can be made by the method according to the second embodiment. In the case in which plural bytes (several hundreds to several M (mega) bytes) are desired to be erased simultaneously, the method of the third embodiment requires a relatively longer time (e.g. about 1.3 sec for 128K bytes in order to save the consumption of electric current for erasing. However, by using the method of the second embodiment in addition to the method of the third embodiment, the erasure can be completed within about 20 msec.

Several typical embodiments of the present invention have been explained. But slight modifications and improvements therefor can be made without departing from the spirit of the present invention. It is needless to say that they should be included in the scope of the present invention. Further, the present invention does not intend to limit the structure of a memory cell. The memory cell may be used as long as its structure can realize the altering system defined in claims.

In accordance with the present invention hitherto described in detail, an altering system for non-volatile semiconductor memory cells can be provided which permits altering and reading using a single power supply voltage which can be easily reduced. Selective writing makes it possible to use memory cells each having a minimum transistor structure and requiring no separation transistor so that the degree of integration of the memory cells can be improved.

I claim:

1. A method of altering a non-volatile semiconductor memory device having plural memory cells arranged in rows and columns, each memory cell including a source, a drain, a channel region located between said source and drain, a control gate provided over said channel region with an interposed insulating layer and a charge injection layer lying between said control gate and said insulating layer, row lines each connected to the control gates of the memory cells on one row, and column lines each connected to the drains of the memory cells on one column, said method comprising, when writing a selected memory cell, the writing steps of:

applying a first voltage lower than a ground potential and a second voltage higher than the ground potential to a first row line connected to the control gate of the selected memory cell and a first column line connected to the drain of the selected memory cell, respectively, so that a potential difference between said first voltage and said second voltage injects charges from the charge injection layer of said selected memory cell into the drain thereof by tunnel effect, thereby placing said memory cell at a writing level;

applying a third voltage lower than said second voltage to a second column line connected with the drain of at least one non-selected memory cell, of which the control gate is connected to said first row line, said third voltage having a value which is insufficient to cause the tunnel effect to be generated between the charge injection layer and the channel region of said non-selected memory cell by a potential difference between said third voltage and said first voltage; and applying a fourth voltage higher than said first voltage and lower than said second voltage to a second row line connected to the control gate of at least one other non-selected memory cell of which the drain is connected to said first column line, said fourth voltage having a value insufficient to cause the tunnel effect to be generated between the charge injection layer and the channel region of the other non-selected memory cell by a potential difference between said fourth voltage and said second voltage; and said method further comprising, when effecting a first erasing mode in which a group of the memory cells including the selected memory cell whose control gates are connected to the first row line are erased, the steps of:

applying a fifth voltage to said first row line, and applying a sixth voltage to said first column line, said second column line and a source line connected to the sources of said plural memory cells so that a potential difference between fifth voltage and said sixth voltage injects negative charges from the channel region of each of said group of the memory cells including the selected memory cell into the charge injection layer thereof by the tunnel effect, thereby placing each of said group of the memory cells at an erasing level;

and comprising, when effecting a second erasing mode in which only said selected memory cell is erased, the steps of:

applying a seventh voltage to said first row line, applying an eighth voltage to said first column line and applying a ninth voltage different from said eighth voltage and higher than the ground potential to the source line so that a potential difference between said seventh voltage and said ninth voltage injects hot electrons from the channel region of said selected memory cell into the charge injection layer thereof, thereby placing said selected memory cell at an erasing level.

2. A method according to claim 1, wherein said first voltage is $-4$ to $-15$ V, said second voltage is a voltage which applies an electric filed of 10 MeV/cm or more to said insulating layer, said third voltage is a voltage lower than said second voltage by at least 2 V and near to the ground potential, and said fourth voltage is a voltage lower than 3 V and near to the ground potential.

3. A method according to claim 1, wherein said sixth voltage is at the ground potential.

4. A method according to claim 1, wherein said sixth voltage is the ground potential and said fifth voltage is higher than a threshold voltage of the memory cell placed at said erasing level, and said first mode erasing steps further include a step of applying a tenth voltage lower than the threshold voltage of the memory cell placed at said writing level and near to said ground potential to another row line other than said first row line.

5. A method according to claim 4, wherein said fifth voltage is 9 to 22 V.

6. A method according to claim 1, wherein said sixth voltage is a voltage lower than the ground potential.

7. A method according to claim 6, wherein said sixth voltage is in a range of $-4$ to $-22$ V.

8. A method according to claim 1, wherein said eighth voltage is lower than said ninth voltage and near to the ground potential and said second mode erasing steps further include a step of applying a tenth voltage almost equal to said ninth voltage to the drain of a non-selected one of the memory cells, of which the control gate is connected to said first row line so that the hot electrons are not injected into said non-selected memory cell.

9. A method according to claim 8, wherein said seventh voltage is 7 to 18 V, said ninth voltage is 2 to 9 V, said eighth voltage is 0 to 2 V, and said tenth voltage is 2 to 9 V.

10. A method of altering a non-volatile semiconductor memory device having plural memory cells arranged in rows and columns, each memory cell including a source, a drain, a channel region located between said source and drain, a control gate provided over said channel region with an interposed insulating layer and a charge injection layer lying between said control gates of the memory cells on one row, and column lines each connected to the drains of the memory cells on one column, said method comprising, when writing a selected memory cell, the writing steps of:

applying a first voltage lower than a ground potential and a second voltage higher than the ground potential to a first row line connected to the control gate of the selected memory cell and a first column line connected to the drain of the selected memory cell, respectively, so that a potential difference between said first voltage and said second voltage injects charges from the charge injection layer of said selected memory cell into the drain thereof by tunnel effect, thereby placing said memory cell at a writing level;

applying a third voltage lower than said second voltage to a second column line connected with the drain of at least one non-selected memory cell, of which the control gate is connected to said first row line, said third voltage having a value which is insufficient to cause the tunnel effect to be generated between the charge injection layer and the channel region of said non-selected memory cell by a potential difference between said third voltage and said first voltage; and, applying a fourth voltage higher than said first voltage and lower than said second voltage to a second row line connected to the control gate of at least one other non-selected memory cell of which the drain is connected to said first column line, said fourth voltage having a value insufficient to cause the tunnel effect to be generated between the charge injection layer and the channel region of the other non-selected memory cell by a potential difference between said fourth voltage and said second voltage; and, said method further comprising erasing only said selected memory cell by performing the erasing steps of:

applying a fifth voltage to said first row line, applying a sixth voltage to said first column line and applying a seventh voltage different from said sixth voltage and higher than the ground potential to the source line so that a potential difference between said fifth voltage and said seventh voltage injects hot electrons from the channel region of said selected memory cell into the charge injection layer thereof, thereby placing said selected memory cell at an erasing level.

11. A method according to claim 10, wherein said sixth voltage is lower than said seventh voltage and near to the ground potential and the erasing steps further include a step of applying an eighth voltage almost equal to said seventh voltage to the drain of a non-selected one of the memory cells, of which the control gate is connected to said first row line so that the hot electrons are not injected into said non-selected memory cell.

12. A method according to claim 10, wherein said fifth voltage is 7 to 18 V, said sixth voltage is 0 to 2 V, said seventh voltage is 2 to 9 volt and said eight voltage is 2 to 9 V.

13. A method according to claim 10, wherein said first voltage is −4 to −15 V, said second voltage is a voltage which applies an electric field of 10 MeV/cm or more to said insulating layer, said third voltage is lower than said second voltage by at least 2 V and near to the ground potential and said fourth voltage is lower than 3 V and near to the ground potential.

14. A method of altering a non-volatile semiconductor memory device including at least one memory cell having a source, a drain, a channel region located between said source and drain, a control gate provided over said channel region with an interposed insulating layer and a charge injection layer lying between said control gate and said insulating layer, said method comprising, when writing the memory cell, the writing steps of:

applying a first voltage lower than a ground potential and a second voltage higher than the ground potential to the control gate of the memory cell and the drain thereof, respectively, so that a potential difference between said first voltage and said second voltage injects charges from the charge injection layer of said memory cell into the drain thereof by tunnel effect, thereby placing said memory cell at a writing level;

and when erasing the memory cell, the erasing steps of:

applying a third voltage to the control gate of the memory cell, applying a fourth voltage to the drain of the memory cell and applying a fifth voltage different from the fourth voltage and higher than the ground potential to the source of the memory cell so that a potential difference between the third voltage and the fifth voltage injects hot electrons from the channel region of the memory cell into the charge injection layer thereof, thereby placing the memory cell at an erasing level.

15. A method according to claim 14, wherein said first voltage is in a range of about −4 to −15 V, said second voltage is a voltage which applies an electric field of 10 MeV/cm or more to said insulating layer, and said third voltage is a voltage lower than said second voltage by at least 2 V and near to said ground potential.

16. A method according to claim 14, wherein said third voltage is in a range of 7 to 18 V and said fifth voltage is in a range of 2 to 9 V.

17. A method according to claim 14, wherein said fourth voltage is lower than said fifth voltage and near to the ground potential.

18. A method according to claim 17, wherein said third voltage is in a range of 7 to 18 V and said fifth voltage is in a range of 2 to 9 V.

* * * * *